(12) United States Patent
Wu et al.

(10) Patent No.: US 8,298,925 B2
(45) Date of Patent: Oct. 30, 2012

(54) MECHANISMS FOR FORMING ULTRA SHALLOW JUNCTION

(75) Inventors: Chii-Ming Wu, Taipei (TW); Yu Lien Huang, Jhubei (TW); Chun Hsiung Tsai, Xinpu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 157 days.

(21) Appl. No.: 12/941,509

(22) Filed: Nov. 8, 2010

(65) Prior Publication Data

US 2012/0112248 A1    May 10, 2012

(51) Int. Cl.
H01L 21/26    (2006.01)
H01L 21/425    (2006.01)
H01L 21/02    (2006.01)

(52) U.S. Cl. ......... 438/513; 438/525; 438/527; 257/408

(58) Field of Classification Search .................. None
See application file for complete search history.

(56) References Cited

U.S. PATENT DOCUMENTS

| | | |
|---|---|---|
| 5,581,202 A | 12/1996 | Yano et al. |
| 5,658,417 A | 8/1997 | Watanabe et al. |
| 5,767,732 A | 6/1998 | Lee et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,727,557 B2 | 4/2004 | Takao |
| 6,740,247 B1 | 5/2004 | Han et al. |
| 6,743,673 B2 | 6/2004 | Watanabe et al. |

(Continued)

FOREIGN PATENT DOCUMENTS

CN    101179046    5/2005

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Scott B Geyer
(74) *Attorney, Agent, or Firm* — Lowe Hauptman Ham & Berner, LLP

(57) ABSTRACT

The embodiments of methods and structures are for doping fin structures by plasma doping processes to enable formation of shallow lightly doped source and drain (LDD) regions. The methods involve a two-step plasma doping process. The first step plasma process uses a heavy carrier gas, such as a carrier gas with an atomic weight equal to or greater than about 20 amu, to make the surfaces of fin structures amorphous and to reduce the dependence of doping rate on crystalline orientation. The second step plasma process uses a lighter carrier gas, which is lighter than the carrier gas for the first step plasma process, to drive the dopants deeper into the fin structures. The two-step plasma doping process produces uniform dopant profile beneath the outer surfaces of the fin structures.

20 Claims, 9 Drawing Sheets

U.S. PATENT DOCUMENTS

| | | |
|---|---|---|
| 6,762,448 B1 | 7/2004 | Lin et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,298,600 B2 | 11/2007 | Takikawa et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,662 B2 | 4/2008 | Siddiqui et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,685,911 B2 | 3/2010 | Wu |
| 7,759,228 B2 | 7/2010 | Sugiyama et al. |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0234422 A1 | 12/2003 | Wang et al. |
| 2004/0192067 A1 | 9/2004 | Ghyselen et al. |
| 2004/0259315 A1 | 12/2004 | Sakaguchi et al. |
| 2005/0020020 A1 | 1/2005 | Collaert et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0266698 A1 | 12/2005 | Cooney, III et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1* | 4/2012 | Tseng et al. .................. 257/288 |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| WO | WO2007/115585 | 10/2007 |

OTHER PUBLICATIONS

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006, pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss University of North Texas, 2008.

Liow, Tsung-Yang et al., "Strained N-Channel FinFETs Featuring in Situ Doped Silicon-Carbon Si1-YCy Source Drain Stessors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

\* cited by examiner

MECHANISMS FOR FORMING ULTRA SHALLOW JUNCTION

CROSS-REFERENCE TO RELATED APPLICATIONS

The present application is related to U.S. patent application Ser. Nos. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

FIELD

This disclosure relates generally to integrated circuit devices and more particularly to processes of doping for field-effect transistors (FETs).

BACKGROUND

Semiconductor integrated circuit microelectronic fabrications are formed from semiconductor substrates within and upon which are formed semiconductor devices. Patterned conductor layers separated by dielectric layers are then formed over the semiconductor substrates to provide interconnect. Ubiquitous within the fabrication of semiconductor integrated circuit microelectronic fabrications is the use of field effect transistor (FET) devices as switching devices within both logic semiconductor integrated circuit microelectronic fabrications and memory semiconductor integrated circuit microelectronic fabrications. The accelerated shrinking of FET dimensions poses particular challenges for doping processes used in transistor fabrication. Dopant ion implantation by ion beams has widely been used to locally modify the electrical properties of silicon. However, ion implantation by ion beams has its limitations for meeting specifications of advanced devices.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
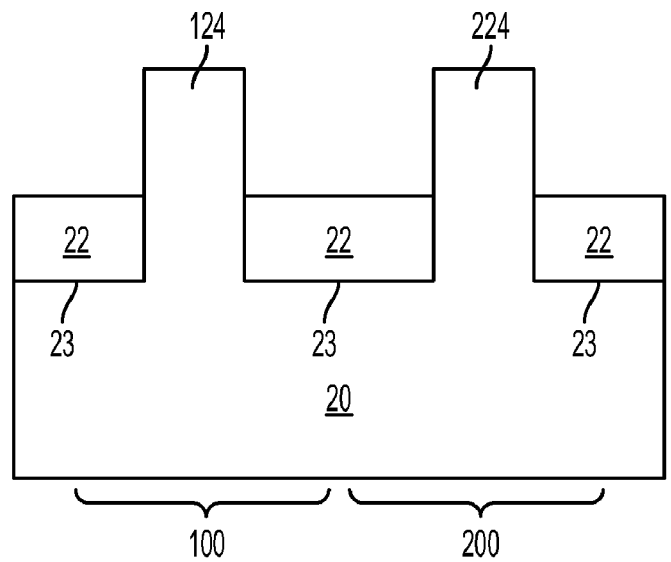
FIG. 1A shows an integrated circuit structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1A shows an integrated circuit structure 10, in accordance with some embodiments. The illustrated integrated circuit structure 10 is formed on a portion of a substrate 20. Substrate 20 may be a silicon substrate, a germanium substrate, or a substrate formed of other semiconductor materials. Substrate 20 may be doped with a p-type or an n-type impurity. Isolation regions, such as shallow trench isolation (STI) regions 22, may be formed in or over substrate 20.

Semiconductor fins 124 and 224 are formed above surfaces 23 of STI regions 22. In some embodiments, substrate 20 includes two PMOS (P-type metal-oxide-semiconductor) device regions 100 and 200, and semiconductor fins 124 and 224 in the PMOS regions respectively, as shown in FIG. 1A. In some other embodiments, device regions 100 and 200 are for NMOS (N-type MOS) devices. In yet some other embodiments, device region 100 is for an NMOS device and device region 200 is for a PMOS device, or vice versa.

In some embodiments, semiconductor fins 124 and 224 are formed by creating (or forming) shallow trench isolation (STI) regions 22, and recessing the top surface of STI regions 22 to a level lower than the original top surface of substrate 20. The remaining portions of substrate 20 between STI regions 22 thus become fins 124 and 224. In some other embodiments, semiconductor fins 124 and 224 are formed of a material different from that of substrate 20. They can be formed by recessing top portions of substrate 20 between neighboring STI regions 22 to form recesses, and re-growing a semiconductor material different from that of substrate 20 in the recesses. Top portions of STI regions 22 may then be removed, while bottom portions of STI regions 22 are not removed. As a result, the top portions of the re-grown semiconductor material between neighboring STI regions 22 become semiconductor fins 124, 224.

Figure 1B:
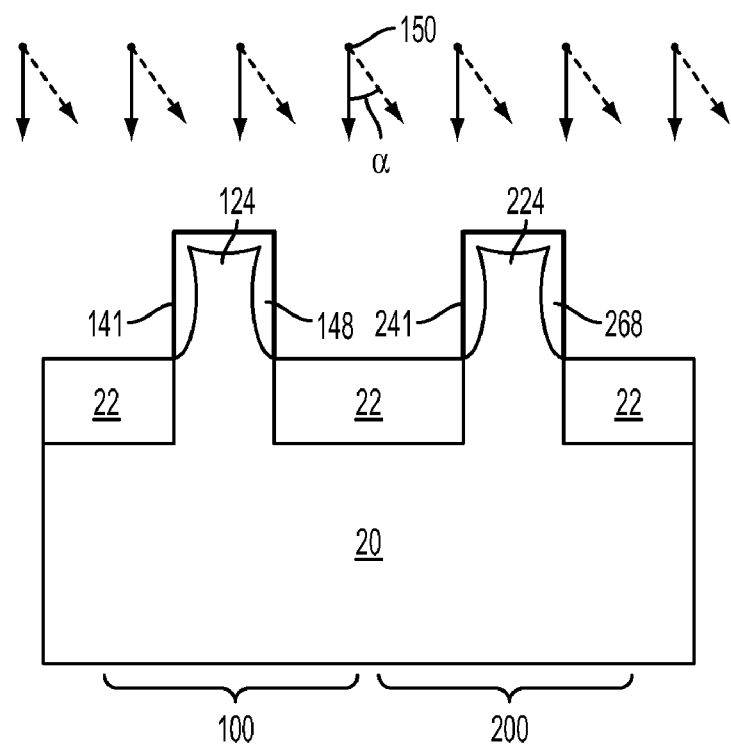
FIG. 1B shows dopant ions being directed toward a substrate and implanted into fin structures to form implanted regions, in accordance with some embodiments.

After fins 124 and 224 are formed, substrate 20 undergoes additional substrate processing to form FET devices. One operation in forming FET devices is doping the lightly doped source and drain (LDD) regions. Conventional LDD doping is performed by ion implantation with the assistance of ion beams. FIG. 1B shows P-type dopant ions 150, such as boron (B) ions, being directed toward substrate 20 and implanted into fins 124 and 224 to form implanted regions 148 and 248, in accordance with some embodiments. The dopants, which are ions, may be directed toward substrate 20 vertically, or tilted toward the sidewalls of fins 124 ad 224 at an angle "α". Due to shadowing effect, the dopant profiles of implanted regions 148 and 248 are not uniform beneath the outer profiles 141, 241 (denoted with bold lines) of fins 124 and 224 respectively. Such uneven dopant profiles of implanted regions 148, 248 and other similar regions are more pronounced for advanced device technologies with high aspect ratios in the spaces between fins. The uneven dopant profiles would be maintained after dopant diffusion and would result in variation in device performance within a die (WID). Further, for advanced device technologies, such as technology nodes below 90 nanometers (nm), junction depth shallower than about 25 nm could be needed. For example, such shallow junction depth is used for FinFET (fin field effect transistor) structures with high aspect ratios, such as aspect ratios equal to or greater than about 1.3 for 22 nm technology nodes, in accordance with some embodiments. Doping by ion beams fails to achieve the requirement of shallow junction depth due to the relatively high energy of ion beams. As a result, new doping mechanisms are needed.

Figure 1C:
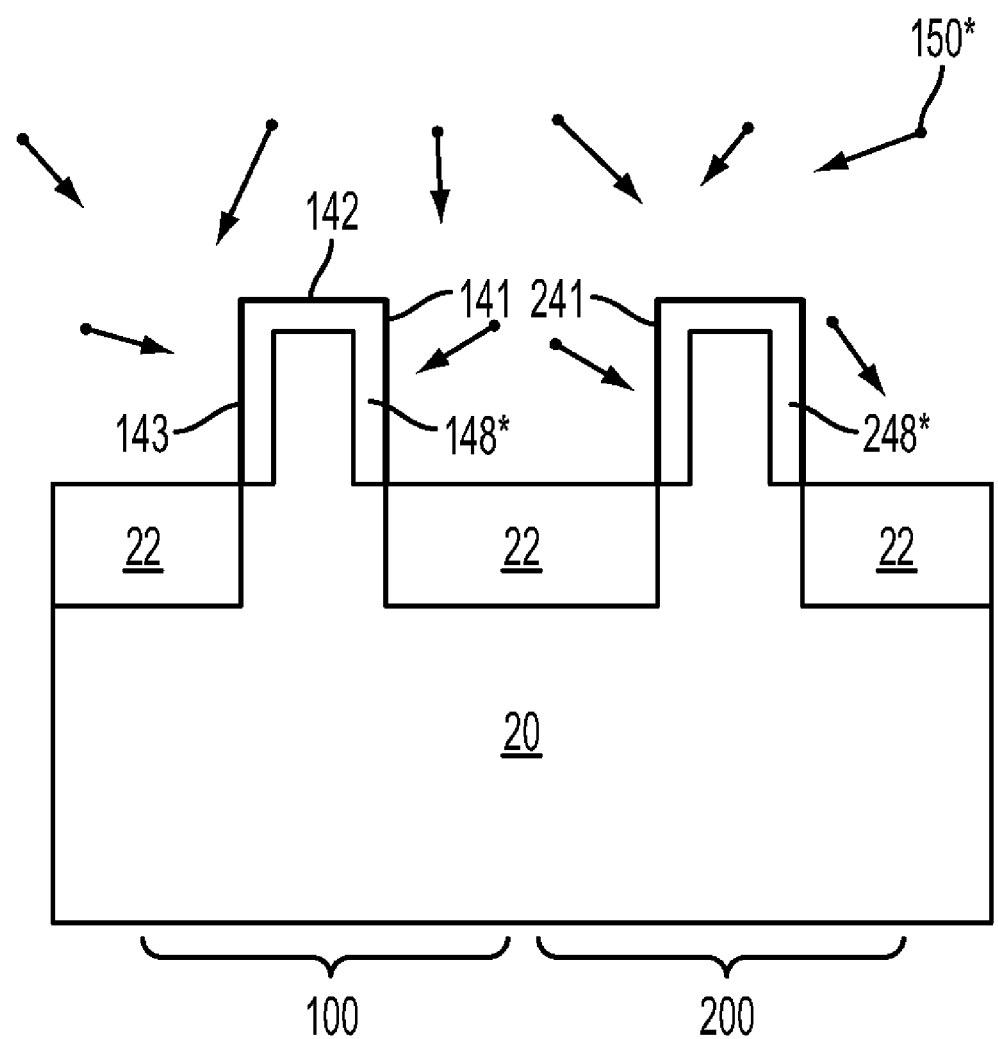
FIG. 1C shows dopant plasma ions directed toward a substrate and implanted into fin structures to form implanted regions, in accordance with some embodiments.

FIG. 1C shows P-type dopant ions 150*, such as boron (B) ions, in the plasma sheath (whose boundary is not shown) right above the surface of substrate 20, directed toward substrate 20 and implanted into fins 124 and 224 to form implanted regions 148* and 248* respectively, in accordance with some embodiments. The method of doping is called "Plasma doping" (PLAD). As shown in FIG. 1C, the dopant plasma ions 150* arrive at the substrate surface in a range of angles, instead of being at a certain angle as in the case of ion implantation by ion beams. Due to the range of arriving angles of the plasma ions, the dopant profiles 148* and 248* are more uniform beneath the outer profiles 141, 241 of semiconductor fins 124, 224. Since the plasma ions have lower energy than the ions of ion beams, shallow junction depth (such as less than about 25 nm) can be achieved.

Semiconductor fins 124 and 224 are made of crystalline or epitaxial materials. In some embodiments, the top surfaces 142 and sidewall surfaces 143 have different crystalline orientation. For example, the top surfaces 142 could be in [100] orientation and the sidewall surfaces 143 could be in [110] orientation. Crystalline surfaces with different orientations could be doped at different rates.

Figure 2A:
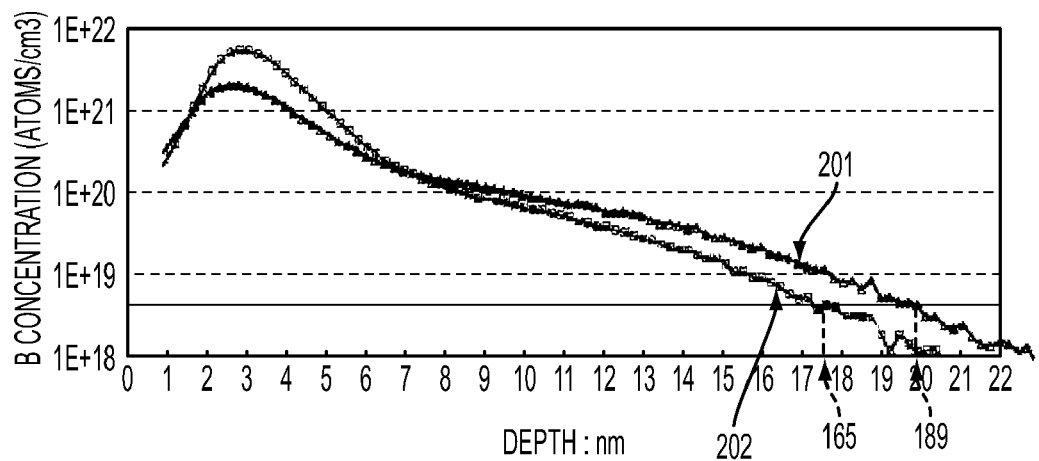
FIG. 2A shows two dopant profiles for two substrates with two different orientations by using a plasma doping process, in accordance with some embodiments.

FIG. 2A shows a dopant profile 201 for a substrate with an [100] orientation on the substrate surface and a dopant profile 202 for another substrate with an [110] orientation on the substrate surface, in accordance with some embodiments. The measurement is taken by secondary ion mass spectroscopy (SIMS). Both substrates (N-type substrates) are doped by plasma doping (PLAD) with boron. The plasma doping was performed in a plasma doping system. An example of plasma doping systems is a PLAD system, made by Varian Semiconductor Equipment Associates Inc. of Gloucester, Massachusetts. The doping gas is made by diluting a reactant gas mixture (15% $B_2H_6$ and 85% $H_2$), diluted by a carrier (or dilution) gas $H_2$. The ratio of the reactant gas to the carrier gas is about 49/80. The pressure of the plasma process is about 50 mTorr and RF (radio frequency) power is in a range from about 100 watts (W) to about 1000 W and at a radio frequency in a range from about 2 kilohertz (KHz) to about 13.6 megahertz (MHz). The substrate is not biased.

Figure 2B:
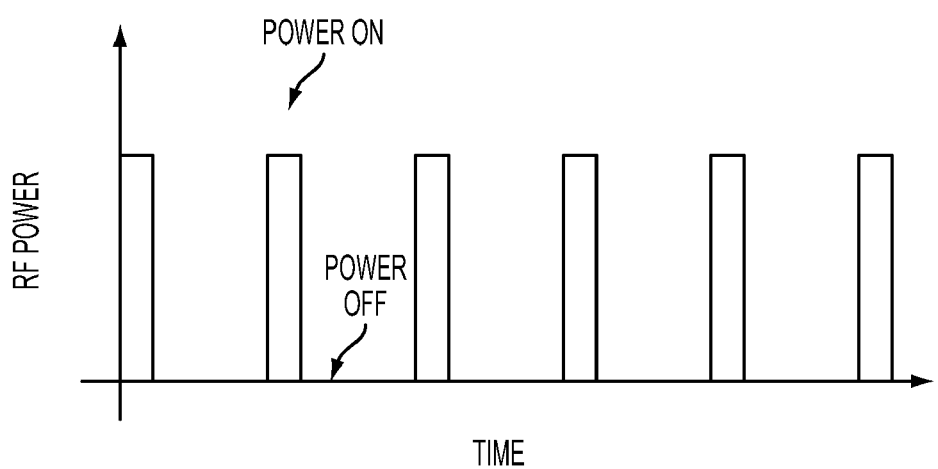
FIG. 2B shows RF power for pulsed plasma as a function of time, in accordance with some embodiments.

The radio frequency (RF) power for generating the plasma could be pulsed. FIG. 2B shows a diagram of power cycle of a pulsed plasma, in accordance with some embodiments. FIG. 2B shows that the RF power is turned on and off periodically. The duty ratio (power-on-time/total-time) of pulse could be in a range from about 5% to about 100%, in accordance with some embodiments. The plasma doping was performed for equal to or less than about 5 minutes. The results are taken after plasma doping and also after a rapid thermal annealing (RTA) at 950° C. for less than about 5 seconds. The results show the junction depth, Xj, is about 16.5 nm for the substrate with [110] surface and about 18.9 nm for the substrate with [100] surface. Junction depth, Xj, is measured at dopant level of about $5E18$ atoms/$cm^3$. Both junction depths, Xj, are less than the 25 nm, as required for advanced device technologies. The difference in junction depth, Xj, at [100] crystalline orientation (top surface) and at [110] crystalline orientation (sidewall surface) indicates a dependence of doping rate on the crystalline orientation.

Figure 2C:
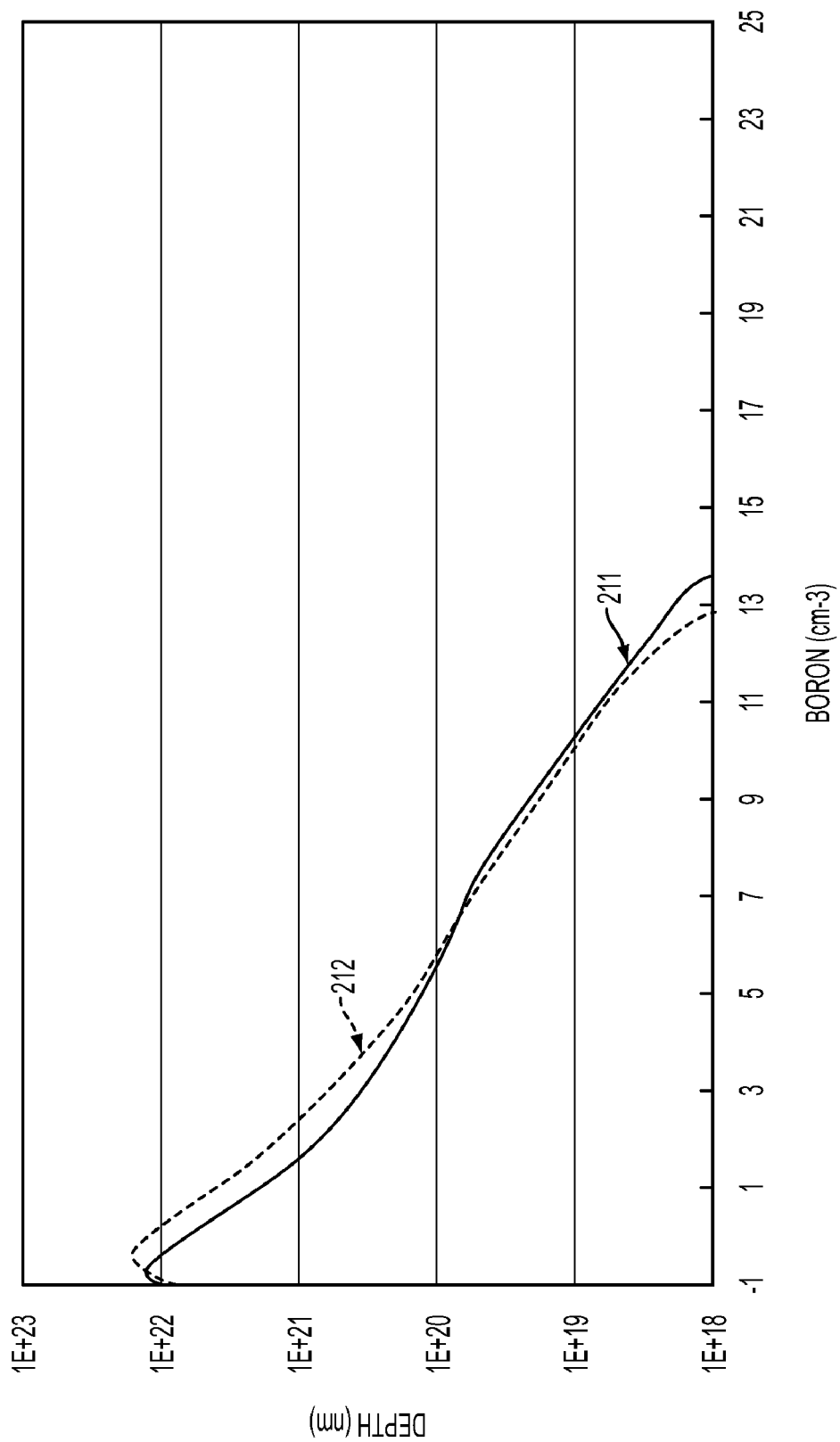
FIG. 2C shows two dopant profiles for two substrates with two different orientations by using another plasma doping process, in accordance with some embodiments.

FIG. 2C shows a dopant profile 211 for a substrate with an [100] orientation on the substrate surface and a dopant profile 212 (dotted line) for another substrate with an [110] orientation on the substrate surface, in accordance with some embodiments. The dopants are also boron. The process gas used in collecting data in FIG. 2C is similar with the exception that the carrier gas is Ar, instead of $H_2$. The results show that the junction depths, Xj, for both substrates are very close and both are at about 11 nm. By using Ar as a carrier gas, the dependence of the junction depth with substrate crystalline orientation disappears. The independence of junction depth from substrate crystalline orientation is more desirable for fin structures with different crystalline orientation of different surfaces of the fins.

Figure 2D:
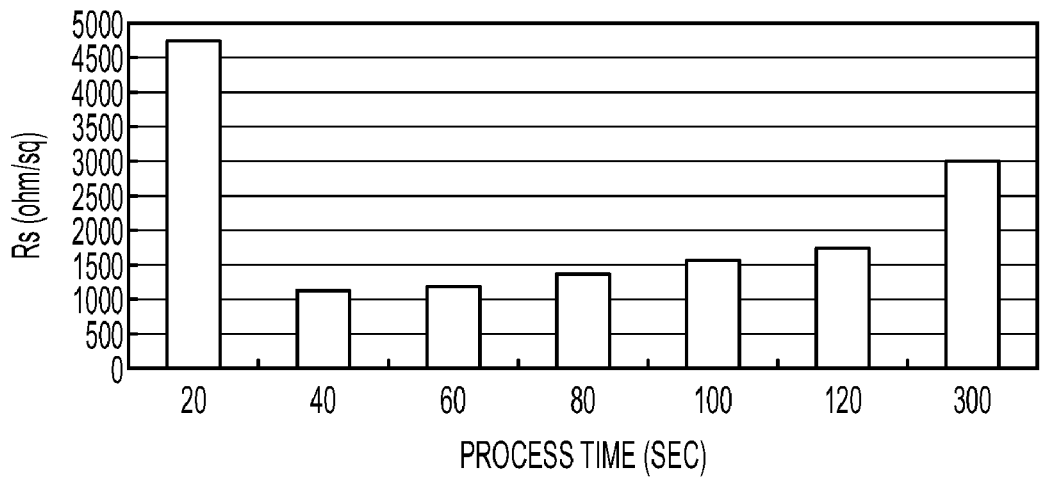
FIG. 2D shows resistivity of fin structures as a function of process time by using the plasma implantation process of FIG. 2C, in accordance with some embodiments.
Figure 2E:
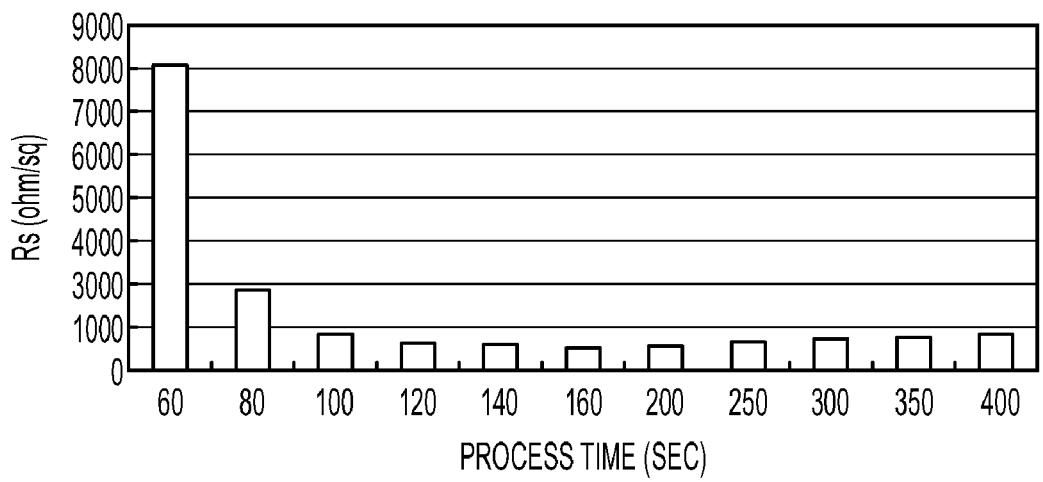
FIG. 2E shows resistivity of fin structures as a function of process time by using the plasma implantation process of FIG. 2A, in accordance with some embodiments.

In addition to the consideration of achieving shallow junction depth (less than about 25 nm) and independence of doping rate on crystalline orientation, a doping process also needs to be repeatable. FIG. 2D shows the resistivity data taken from the substrates of FIG. 2C (Ar as the carrier gas), in accordance with some embodiments. The resistivity data are taken from diffusion regions after the substrates are plasma doped with boron and are annealed. The data show that the resistivity varies significantly with the process time, which indicates very limited region(s) to produce repeatable results. In contrast, FIG. 2E shows the resistivity data taken from the substrate of FIG. 2A ($H_2$ as the carrier gas), in accordance with some embodiments. The data show that the resistivity is stable between about 120 seconds to about 250 seconds of process time, which is a fairly wide process window.

The data in FIGS. 2A and 2C-2E show that using Ar as a carrier gas removes the dependence of doping rate on crystalline orientation of the surface (i.e. [100] surface versus [110] surface). However, the resistivity data show that the process window of such process is too narrow to produce repeatable results. In contrast, the process window of the process using $H_2$ as a carrier (or dilution) gas is much wider and usable to produce repeatable results. However, the process of using $H_2$ as a carrier gas shows a dependence of doping rate on the crystalline orientation of the substrate.

Figure 3:
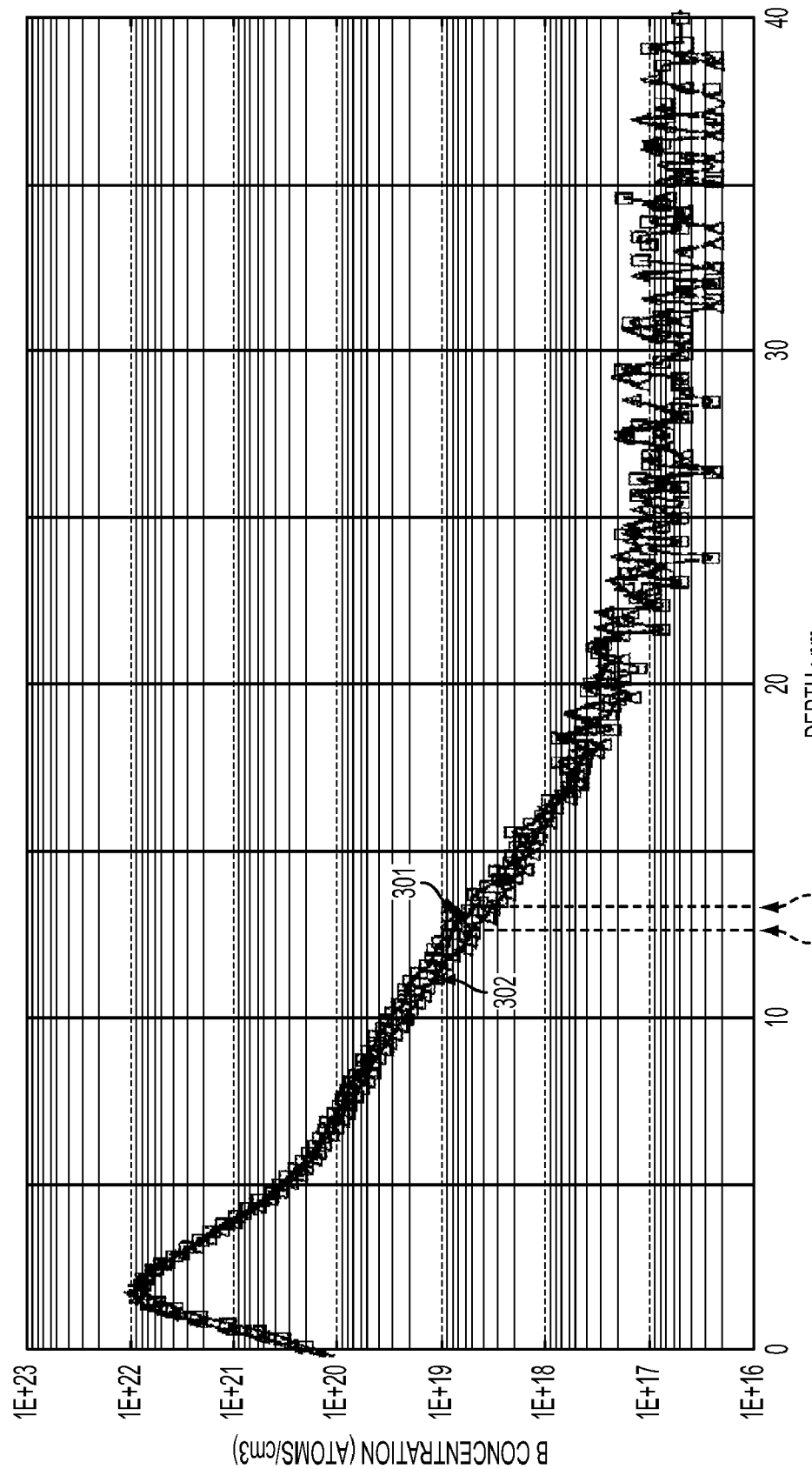
FIG. 3 shows two dopant profiles for two substrates with two different orientations by using a two-step plasma implantation process, in accordance with some embodiments.

FIG. 3 shows dopant profiles 301 (data with square symbol) and 302 (data with triangle symbol) for substrates with [100] surface orientation and [110] surface orientation respectively, in accordance with some embodiments. The plasma doping (PLAD) process used to generate the data in FIG. 3 uses a two-step process. The two-step process includes a first plasma doping process using Ar as a carrier gas to eliminate or reduce the dependence of doping rate on the crystalline orientation. The process condition and gas mixture for the first plasma doping process using Ar as a carrier gas has been described above for FIGS. 2C and 2D. The second plasma doping process uses $H_2$ as a carrier gas to achieve repeatable doping profiles from wafer to wafer, which has been described above for FIGS. 2A and 2E. The first plasma doping is performed for a duration in a range from about 10 seconds to about 100 seconds and the second plasma doping is performed for a duration in a range from about 10 seconds to about 300 seconds. In some embodiments, the duration for the second plasma is shorter than the duration of the first plasma. The data in FIG. 3 are taken after the 2-step plasma doping process and also a 950° C. thermal anneal. The thermal anneal is performed in a rapid thermal annealing system at peak temperature (950° C.) for equal to or less than about 5 seconds.

Dopant profiles 301 and 302 match pretty closely along the entire curves. The junction depth, Xj, for the substrate with [100] surface is measured to be about 12.6 nm, and the junction depth for the substrate with [110] surface is measured to be about 13.7 nm. The two junction depths are fairly close. The first-step doping plasma process using a relatively heavy carrier gas, such as Ar (atomic weight 40 amu) or Ne (atomic weight 20 amu), likely bombards the crystalline surface to make the substrate surface slightly amorphous, which eliminates or reduces the dependence of doping rate on crystalline orientation. The slightly amorphous surface allows the second-step doping process with a lighter carrier gas, such as $H_2$ or He, to deliver dopants deeper into the substrate repeatably. The slightly amorphous substrate surface can be re-crystallized again by the following annealing process(es) and does not impact the performance of the FETs.

Figure 4A:
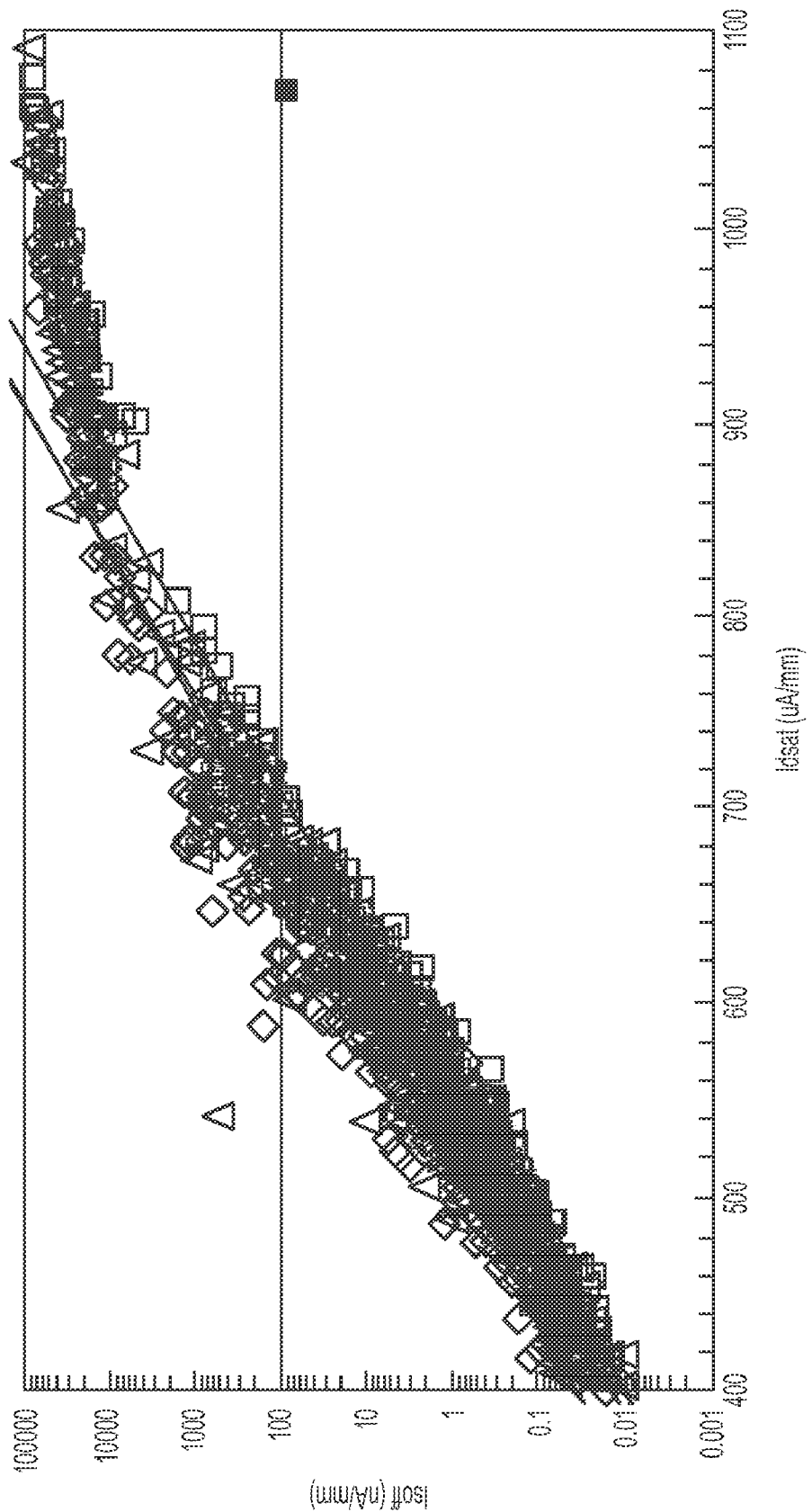
FIGS. 4A-4D compare electrical results of fin structures for three different processes, in accordance with some embodiments.

FIG. 4A shows data of Isoff (nA/μm) versus Idsat (nA/μm), in accordance with some embodiments. Isoff measures the current (off current) when the gate voltage (Vg) is set at zero, and Idsat measures the current (on current at saturation region) when the source voltage (Vs) is set at zero. The data are taken from finFET devices on substrates processed with three different processes. The $1^{st}$ process is a reference process using the conventional ion beams to drive dopants. The results of the $1^{st}$ process are marked by "diamond" symbol. The $2^{nd}$ process is a two-step plasma doping process described above with bias voltage set at 0 volt (no bias). The results of the $2^{nd}$ process are marked by "square" symbol. The $3^{nd}$ process is a two-step plasma doping process described above with bias voltage set at 0.3 KV (no bias). The results of the $3^{nd}$ process are marked by "triangle" symbol. The $3^{rd}$ process is similar to the $2^{nd}$ process with the exception that the bias voltage is 0.3 KV with the substrate being negatively biased. The Idsat is measured at Isoff equal to about 100 nA/μm. The results show that the Idsat is about 665.4 nA/μm for the $1^{st}$ process, about 702.4 for the $2^{nd}$ process and about 678.9 for the $3^{rd}$ process. The Idsat of the $1^{st}$ process is the lowest and the Idsat of the $2^{rd}$ process is the highest. The $2^{nd}$ process increases Idsat by about 5.6% over the reference process (1st process). The $3^{rd}$ process increases Idsat by about 2.0% over the reference process. The results indicate an improvement in Idsat by using a plasma doping process, especially a plasma doping process without bias voltage.

Figure 4B:
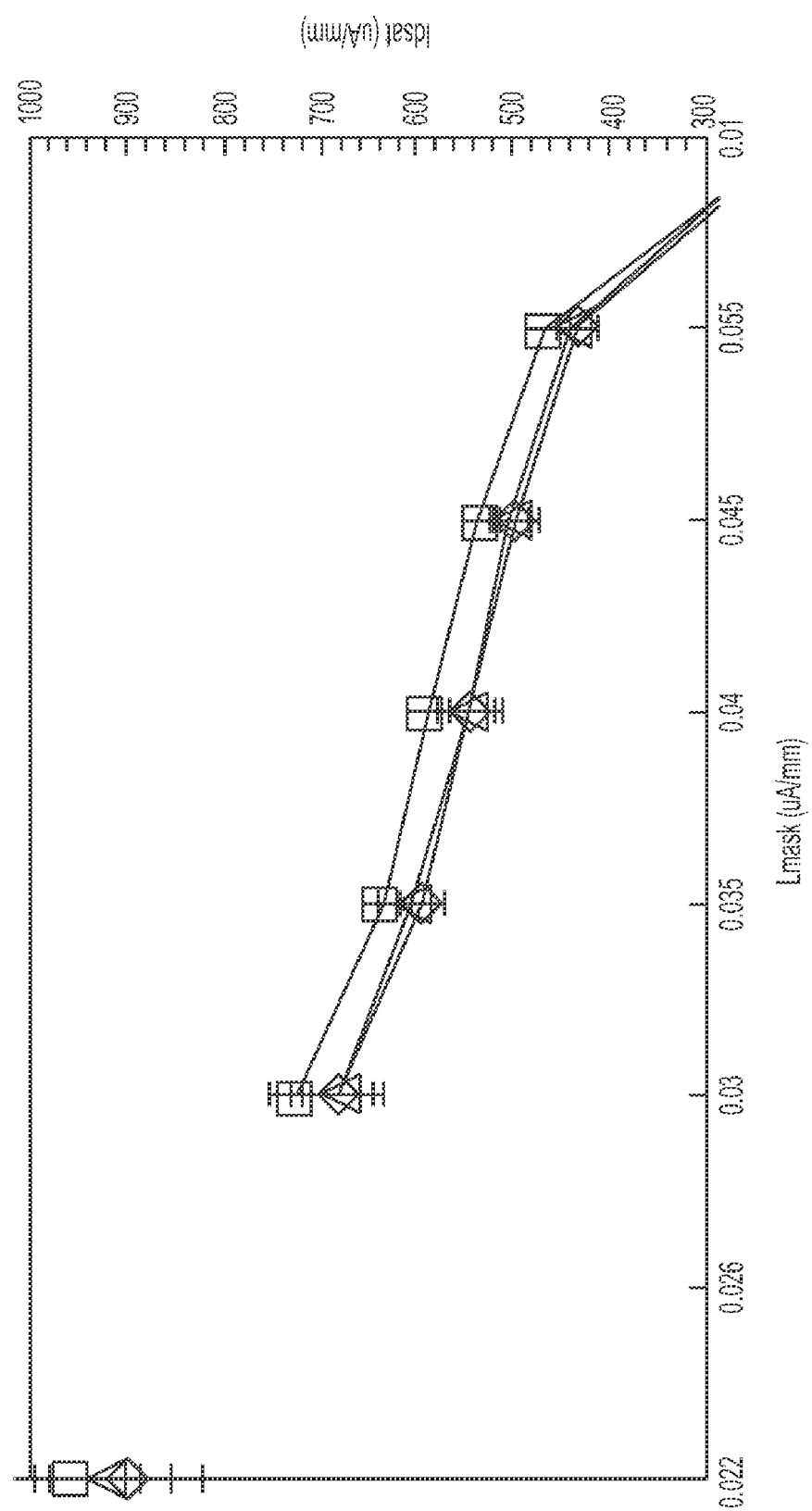

FIG. 4B shows the Idsat as a function of gate length (or gate width), in accordance with some embodiments. Lmask is the layout gate length, which could be different from actual gate lengths. However, the actual gate lengths increase with the layout gate lengths. The data in FIG. 4B show that Idsat of the $2^{nd}$ process is consistently higher than the Idsat of the $1^{st}$ and $3^{rd}$ processes for different gate lengths between about 0.03 μm to about 0.055 μm.

Figure 4C:
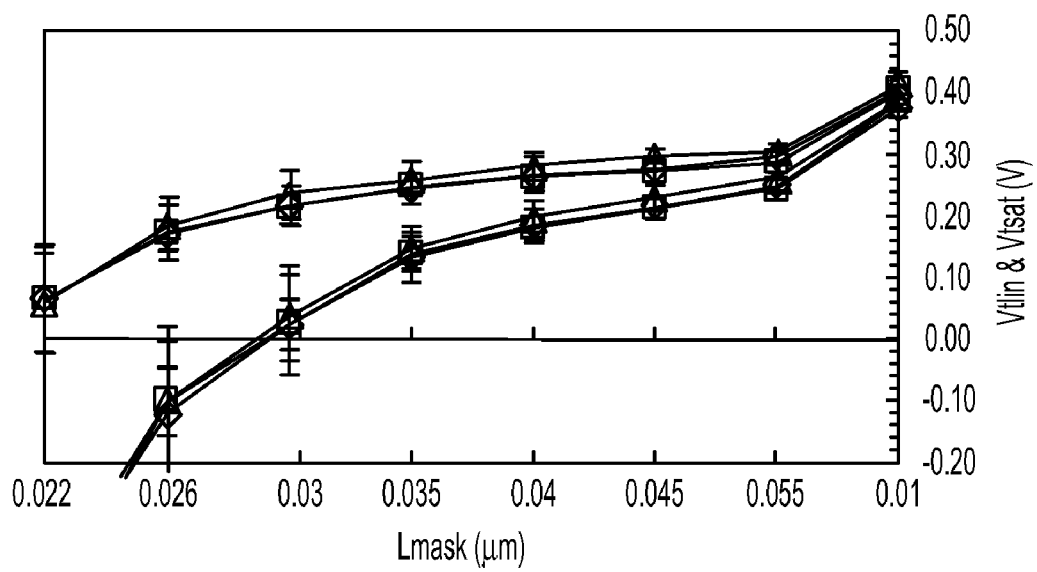

FIG. 4C shows Vtlin and Vtsat versus layout gate length (Lmask), in accordance with some embodiments. Vtlin is a measure of the gate voltage when the drain current is measurable and when the Vsource is set at zero and the Vdrain is set at 0.05V. Vtsat is a measure of the gate voltage when the drain voltage is measurable and when the Vsource is set at zero and the Vdrain is set at high value (such as greater than about 0.5 V, i.e. at saturation). The data show no significant difference of Vtlin and Vtsat between 3 different processes with gate widths between about 0.022 nm to about 0.1 nm.

Figure 4D:
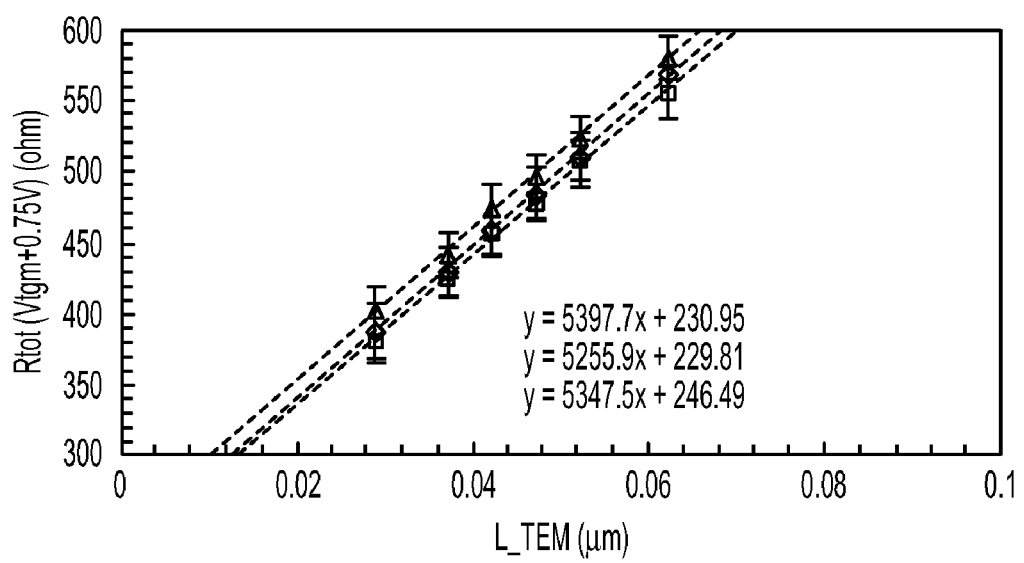

FIG. 4D shows the resistance of FinFET devices as a function of gate length (L_TEM) of the measured FinFET devices, in accordance with some embodiments. L_TEM is a gate length calibrated by a transmission electron microscope (TEM). The data in FIG. 4D show resistivities for the 3 doping methods with data analyzed into linear lines and equations. The resistivity data for the 3 doping methods vary linearly with gate length.

$$Rs(1^{St} \text{Process}) = 5397.7 \times L\_TEM + 230.9 \quad (1)$$

$$Rs(2^{nd} \text{Process}) = 5255.9 \times L\_TEM + 229.8 \quad (2)$$

$$Rs(3^{rd} \text{Process}) = 5347.5 \times L\_TEM + 246.5 \quad (3)$$

The results show no abnormality of resistances and mobilities of dopants of FinFET devices for these 3 doping methods. The slopes of equations are inversely proportional to the mobility (1/μ) of dopants. The results show that dopants for the $2^{nd}$ process (plasma doping with zero bias) have the highest mobility in comparison to the other two processes. The results also indicate that the 2-step plasma doping process can be used as a doping process.

The plasma doping methods and results described above indicate that a 2-step plasma doping processes have good process windows and produce good device performance data. The plasma doping process with zero bias produces better Idsat data than the process with a bias of about 0.3 KV. Both plasma doping processes, with zero bias and 0.3 KV bias, show better doping performance than the conventional ion beam doping process.

The annealing temperature used in the study above is about 950° C. Alternatively, the annealing temperature for LDD formation can be in a range from about 900° C. to about 1350° C. for a duration from milliseconds (ms) to minutes. As mentioned above, the plasma may be pulsed with duty ratio in a range from about 5% to about 100%. The RF power frequency may be in a range from about 2 KHz to about 13.6 MHz. In some embodiments, the RF power supply can have dual frequencies. The doping plasma may be generated in the processing chamber or remotely (remote plasma).

The annealing process used for collecting data in FIGS. 2A and 2C-4D is rapid thermal annealing (RTA). Alternatively, the annealing process can be laser anneal or flash anneal. The annealing time can be in a range from about 50 µs (micro seconds) to about 10 minutes. The doping gas in the example is a mixture of 15% $H_2B_6$ with 85% of $H_2$. Other ratios of gas mixtures may also be used. In addition, the boron containing gas does not need to be $H_2B_6$. Other types of boron-containing gas, such as $BF_3$, may also be used. The boron-containing gas does not need to be mixed with $H_2$. Other types of inert gas, such as He, Ar, Ne, Kr, Xe, may also be used. In some embodiments, $N_2$ may also be a carrier gas. However, heavier carrier gas, such as Ne, Ar, Kr, Xe, $N_2$, may be used to prepare the gas mixture for the first-step plasma doping process and lighter carrier gas, such as He or $H_2$, may be used for preparing the gas mixture for the second-step plasma doping process.

In some embodiments, the dopant-containing gas used in the first doping plasma, which makes the substrate surface slightly amorphous and doping process less sensitive to crystalline orientation of the substrate, is different from the dopant-containing gas used in the second doping plasma, which is used to drive the dopants deeper into the substrate. For example, if the dopant is boron, the dopant-containing gas used in the first doping plasma could be $B_2H_6$ and the dopant-containing gas used in the second doping plasma could be $BF_3$, or vice versa. The bias voltage applied on the substrate may also be turned on and off periodically to modify the doping characteristics in a manner similar to RF power being turned on and off to generate pulsed plasma, as shown in FIG. 2B. The duty ratio (power-on-time/total-time) of bias pulse could also be in a range from about 5% to about 100%, in accordance with some embodiments.

The embodiments of methods described above for doping a substrate to form shallow LDD regions are described for PMOS. Similar methods also apply for NMOS, which uses N-type dopants, such as P and As. Phosphorous-containing or As-containing gas may be used for the doping LDD regions in manner described above for using boron-containing gas to dope P-type LDD.

The embodiments of methods and structures described above for doping fin structures by plasma doping process enable formation shallow lightly doped source and drain (LDD). The methods involve a two-step plasma doping process. The first step plasma process uses a heavy carrier gas, such as a carrier gas with an atomic weight equal to or greater than about 20 amu, to make the surfaces of fin structures amorphous and to reduce the dependence of doping rate on crystalline orientation. The second step plasma process uses a lighter carrier gas, which is lighter than the carrier gas for the first step plasma process, to drive the dopants deeper into the fin structures. The two-step plasma doping process produces uniform dopant profile beneath the outer surfaces of the fin structures.

In one embodiment, a method of doping a shallow lightly doped source and drain (LDD) regions of fin structures on a substrate is provided. The method includes applying a first doping plasma on the shallow LDD regions of the fin structures. The fin structures have surfaces with more than one crystalline orientation, and a first source gas of the first doping plasma includes a first dopant-containing gas and a first carrier gas, wherein the first dopant-containing gas includes the dopant. The doping rate of the first doping plasma is significantly the same on different surfaces of the fin structures with more than one crystalline orientation. The method also includes applying a second doping plasma on the shallow LDD regions of the fin structures after the first doping plasma is applied. A second source gas of the second doping plasma includes a second dopant-containing gas and a second carrier gas, and the second doping plasma delivers the dopant deeper below surfaces of the shallow LDD regions of the fin structures.

In another embodiment, a method of doping a shallow lightly doped source and drain (LDD) regions of fin structures on a substrate is provided. The method includes applying a first doping plasma on the shallow LDD regions of the fin structures, and the fin structures have surfaces with more than one crystalline orientation. A first source gas of the first doping plasma includes a first dopant-containing gas and a first carrier gas, and the first dopant-containing gas includes the dopant. The doping rate of the first doping plasma is significantly the same on different surfaces of the fin structures with more than one crystalline orientation. The method further includes applying a second doping plasma on the shallow LDD regions of the fin structures after the first doping plasma is applied. A second source gas of the second doping plasma includes a second dopant-containing gas and a second carrier gas. The second doping plasma delivers the dopant deeper below surfaces of the shallow LDD regions of the fin structures, and the dopant profiles of the shallow LDD regions are uniform beneath the outer profiles of the fin structures. In addition, the method includes performing a thermal annealing on the substrate after the second doping plasma is applied.

In yet another embodiment, a fin field-effect transistor (FinFET) having a fin structure with a shallow lightly doped source and drain (LDD) region is provided. The fin structure has a top surface with a first crystalline orientation. Two sidewall surfaces of the fin structure have a second crystalline orientation. The shallow LDD region is uniform beneath the top surface and the two sidewall surfaces of the fin structure, and dopants in the shallow LDD region are implanted in the fin structure by a two-step plasma doping process. A first step plasma doping process of the two-step plasma doping process uses a carrier gas with an atomic weight equal to or greater than 20 amu, and the first step plasma doping process makes the top surface and the two sidewall surfaces amorphous to reduce the difference in crystalline orientation of surfaces of the fin structure to enable dopants to be implanted uniformly beneath the surfaces of the fin structures by the second-step plasma doping process.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of doping shallow lightly doped source and drain (LDD) regions of fin structures on a substrate, comprising:

applying a first doping plasma on the shallow LDD regions of the fin structures, wherein the fin structures have surfaces with more than one crystalline orientation, wherein a first source gas of the first doping plasma includes a first dopant-containing gas and a first carrier gas, wherein the first dopant-containing gas includes the dopant, wherein the doping rate of the first doping plasma is significantly the same on different surfaces of the fin structures with more than one crystalline orientation; and applying a second doping plasma on the shallow LDD regions of the fin structures after the first doping plasma is applied; wherein a second source gas of the second doping plasma includes a second dopant-containing gas and a second carrier gas, wherein the second doping plasma delivers the dopant deeper below surfaces of the shallow LDD regions of the fin structures.

2. The method of claim 1, further comprising:
performing a thermal annealing on the substrate after the second doping plasma is applied.

3. The method of claim 2, wherein the temperature of the thermal annealing is in a range from about 900° C. to about 1350° C.

4. The method of claim 1, wherein the dopant profiles of the shallow LDD regions are uniform beneath outer profiles of the fin structures.

5. The method of claim 1, wherein depths of the shallow LDD regions are less than about 25 nm.

6. The method of claim 1, wherein depths of the shallow LDD regions are less than about 20 nm.

7. The method of claim 1, wherein the dopant is boron, phosphorous, or Arsenic.

8. The method of claim 1, wherein the first and second doping plasmas are generated remotely.

9. The method of claim 1, wherein the first dopant-containing gas and the second dopant-containing gases are both $B_2H_6$ or both $BF_3$, and wherein both dopant-containing gases are mixed with $H_2$.

10. The method of claim 1, the first carrier gas is selected from a group consisting of Ar, Ne, Kr, Xe, and $N_2$.

11. The method of claim 1, wherein the second carrier gas is He or $H_2$.

12. The method of claim 1, wherein a bias voltage is set to be zero when the first and the second doping plasma are applied.

13. The method of claim 1, wherein a bias voltage is set to be less than about 0.3 KV when the first and the second doping plasma are applied.

14. The method of claim 1, wherein the first doping plasma and the second doping plasma are pulsed plasmas with duty ratios in a range from about 5% to about 100%.

15. The method of claim 1, wherein top surfaces of the fin structures have [100] crystalline orientation and side surface of the fin structures have [110] crystalline orientation.

16. A method of doping shallow lightly doped source and drain (LDD) regions of fin structures on a substrate, comprising:

applying a first doping plasma on the shallow LDD regions of the fin structures, wherein the fin structures have surfaces with more than one crystalline orientation, wherein a first source gas of the first doping plasma includes a first dopant-containing gas and a first carrier gas, wherein the first dopant-containing gas includes the dopant, wherein the doping rate of the first doping plasma is significantly the same on different surfaces of the fin structures with more than one crystalline orientation;

applying a second doping plasma on the shallow LDD regions of the fin structures after the first doping plasma is applied; wherein a second source gas of the second doping plasma includes a second dopant-containing gas and a second carrier gas, wherein the second doping plasma delivers the dopant deeper below surfaces of the shallow LDD regions of the fin structures, and wherein the dopant profiles of the shallow LDD regions are uniform beneath outer profiles of the fin structures; and performing a thermal annealing on the substrate after the second doping plasma is applied.

17. The method of claim 16, wherein the first dopant-containing gas and the second dopant-containing gas are both $B_2H_6$ or both $BF_3$, and wherein both dopant-containing gases are mixed with $H_2$.

18. The method of claim 16, wherein the first carrier gas is selected from a group consisting of Ar, Ne, Kr, Xe, and $N_2$, and wherein the second carrier gas is He or $H_2$.

19. A fin field-effect transistor (finFET) having a fin structure with a shallow lightly doped source and drain (LDD) region, comprising:

the fin structure, wherein a top surface of the fin structure has a first crystalline orientation, and wherein two sidewall surfaces of the fin structure have a second crystalline orientation, and wherein the shallow LDD region is uniform beneath the top surface and the two sidewall surfaces of the fin structure, and wherein dopants in the shallow LDD region are implanted in the fin structure by a two-step plasma doping process, and wherein a first step plasma doping process of the two-step plasma doping process uses a carrier gas with an atomic weight equal to or greater than 20 amu, and wherein the first step plasma doping process makes the top surface and the two sidewall surfaces amorphous to reduce the difference in crystalline orientation of surfaces of the fin structure to enable dopants to be implanted uniformly beneath the surfaces of the fin structures by the second-step plasma doping process.

20. The fin structure of claim 19, wherein the first crystalline orientation is [100] and the second crystalline orientation is [110].

* * * * *